United States Patent

Wang et al.

[11] Patent Number: 5,771,442
[45] Date of Patent: Jun. 23, 1998

[54] DUAL MODE TRANSMITTER

[75] Inventors: Hefeng Wang; Tetsuo Onodera, both of Tokyo, Japan

[73] Assignee: OKI Electric Industry Co., Ltd., Tokyo, Japan

[21] Appl. No.: 556,001

[22] Filed: Nov. 13, 1995

[30] Foreign Application Priority Data

Nov. 11, 1994 [JP] Japan .................................. 6-277493

[51] Int. Cl.$^6$ .................................................. H04B 1/02
[52] U.S. Cl. ...................... 455/93; 455/553; 455/102; 455/110; 455/118; 455/318; 375/216; 332/119; 332/123
[58] Field of Search .................................. 455/33.1, 422, 455/42, 73, 75–76, 78, 80–82, 84–86, 88–89, 575, 91, 93, 95, 102–103, 110, 118, 119, 129, 127, 205, 208, 209, 255–256, 260, 265, 313, 318, 321, 323, 553; 332/119, 127, 128; 375/216, 295–297, 308, 284, 385, 779

[56] References Cited

U.S. PATENT DOCUMENTS

| | | | |
|---|---|---|---|
| 5,020,076 | 5/1991 | Cahill et al. | 375/216 |
| 5,020,093 | 5/1991 | Pireh | 455/77 |
| 5,179,360 | 1/1993 | Suzuki | 332/119 |
| 5,228,074 | 7/1993 | Mizikovsky | 455/88 |
| 5,251,232 | 10/1993 | Nonami | 455/84 |
| 5,309,429 | 5/1994 | Fukuda | 455/86 |
| 5,483,696 | 1/1996 | Wheatley, III et al. | 455/318 |

*Primary Examiner*—Reinhard J. Eisenzopf
*Assistant Examiner*—Doris To
*Attorney, Agent, or Firm*—Spencer & Frank

[57] ABSTRACT

In a dual mode transmitter for modulating, in a digital mode, an input digital signal and transmitting a modulated digital signal and modulating, in an analog mode, an input analog signal and transmitting a modulated analog signal, a digital modulating section modulates the input digital signal to thereby generate the modulated digital signal, and outputs the modulated digital signal. An analog modulator/carrier generator modulates the input analog signal to thereby generate the modulated analog signal, and outputs it. Also, the analog modulator/carrier generator generates a carrier signal for up-converting the modulated digital signal. The up-converter up-converts, in the digital mode, the modulated digital signal by using the carrier signal and receives, in the analog mode, the modulated analog signal and passes it therethrough.

6 Claims, 8 Drawing Sheets

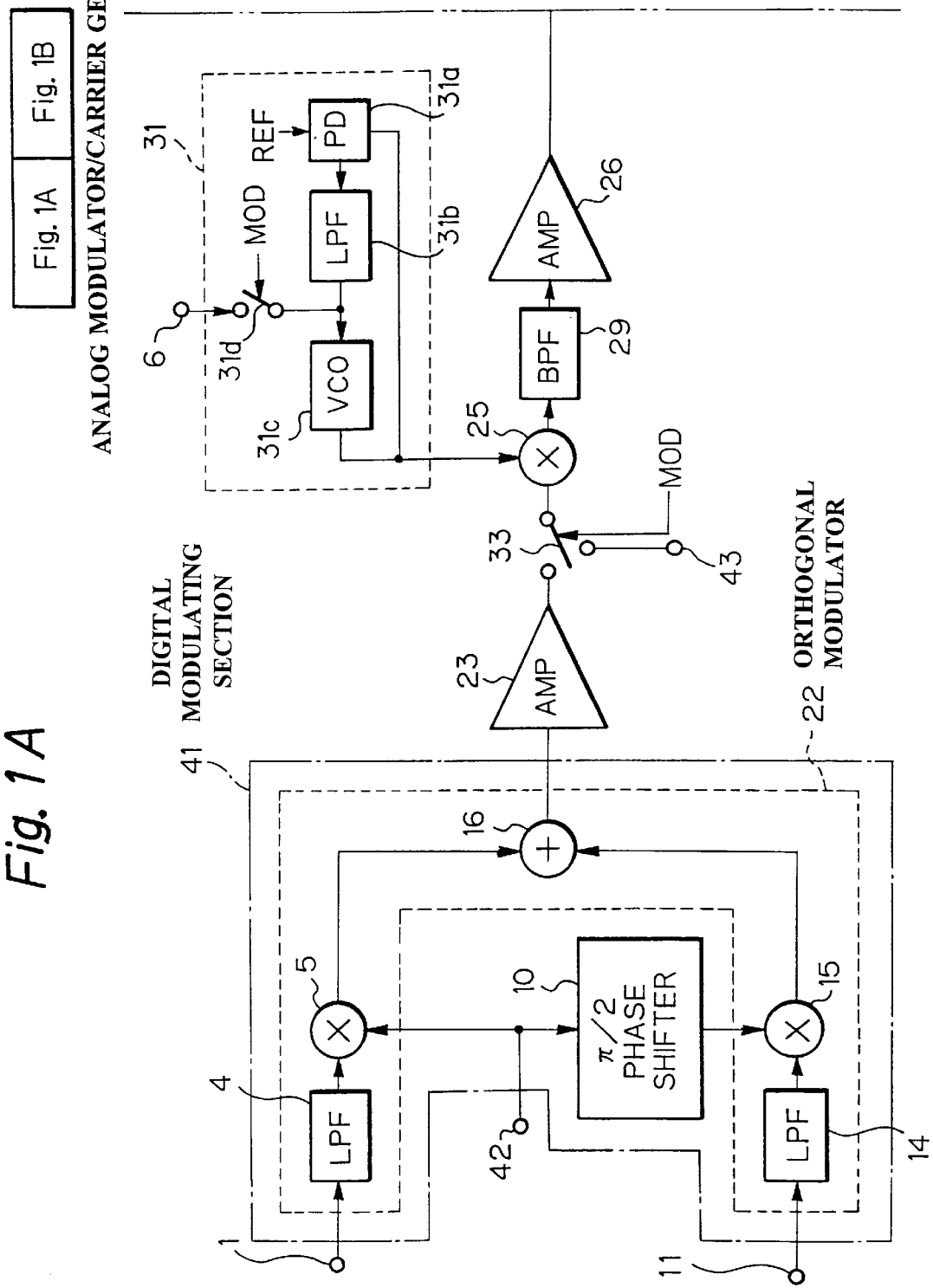

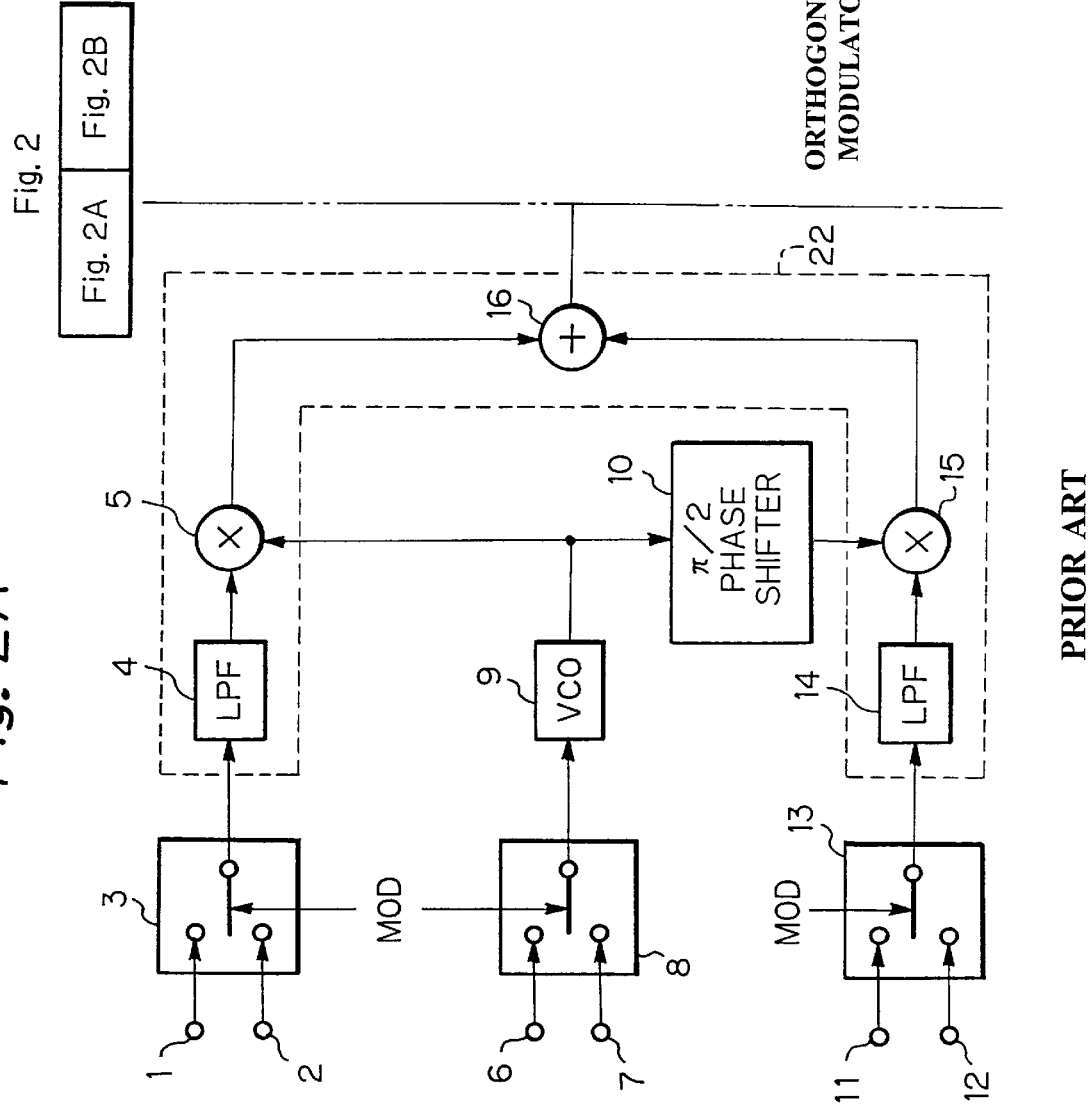

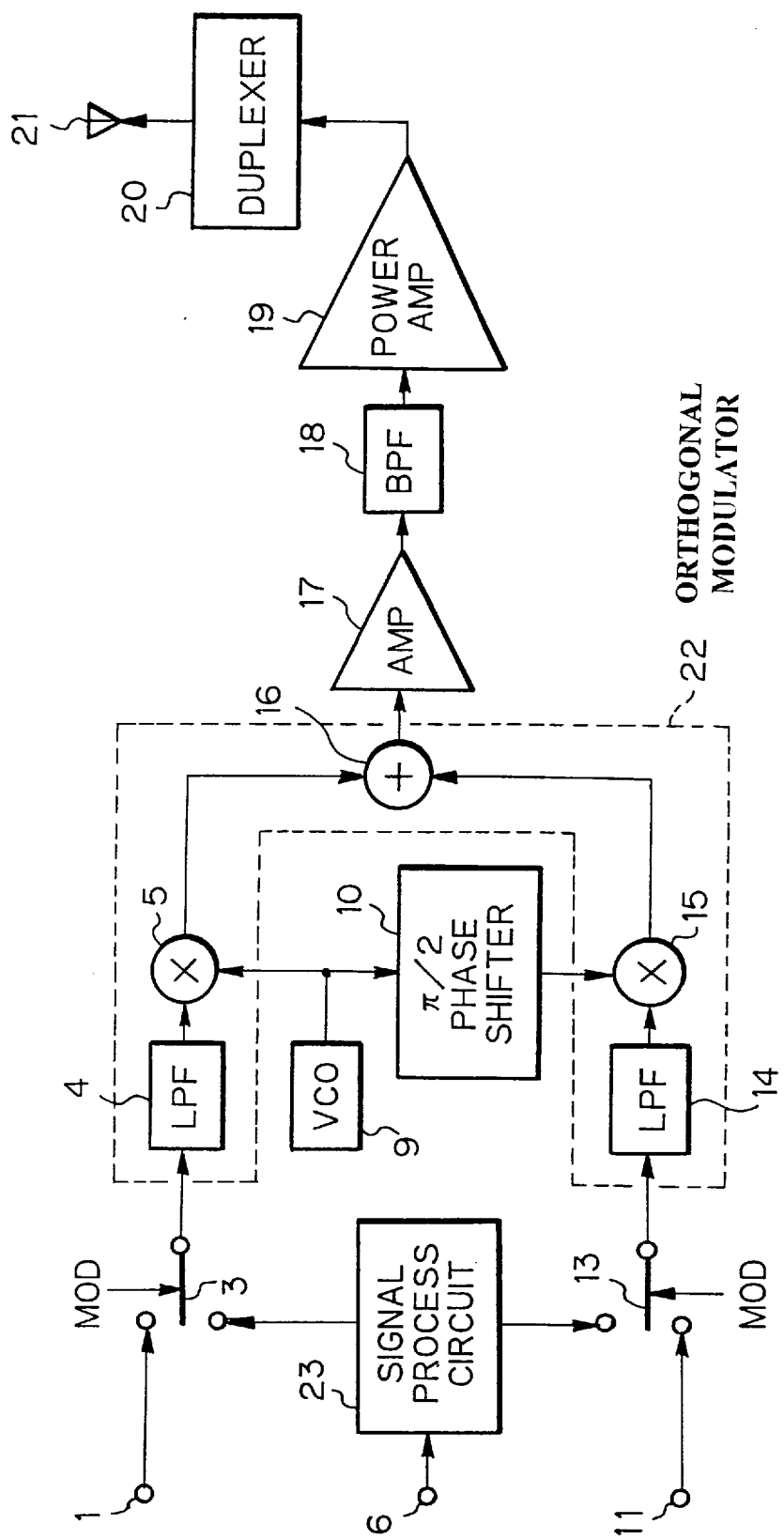

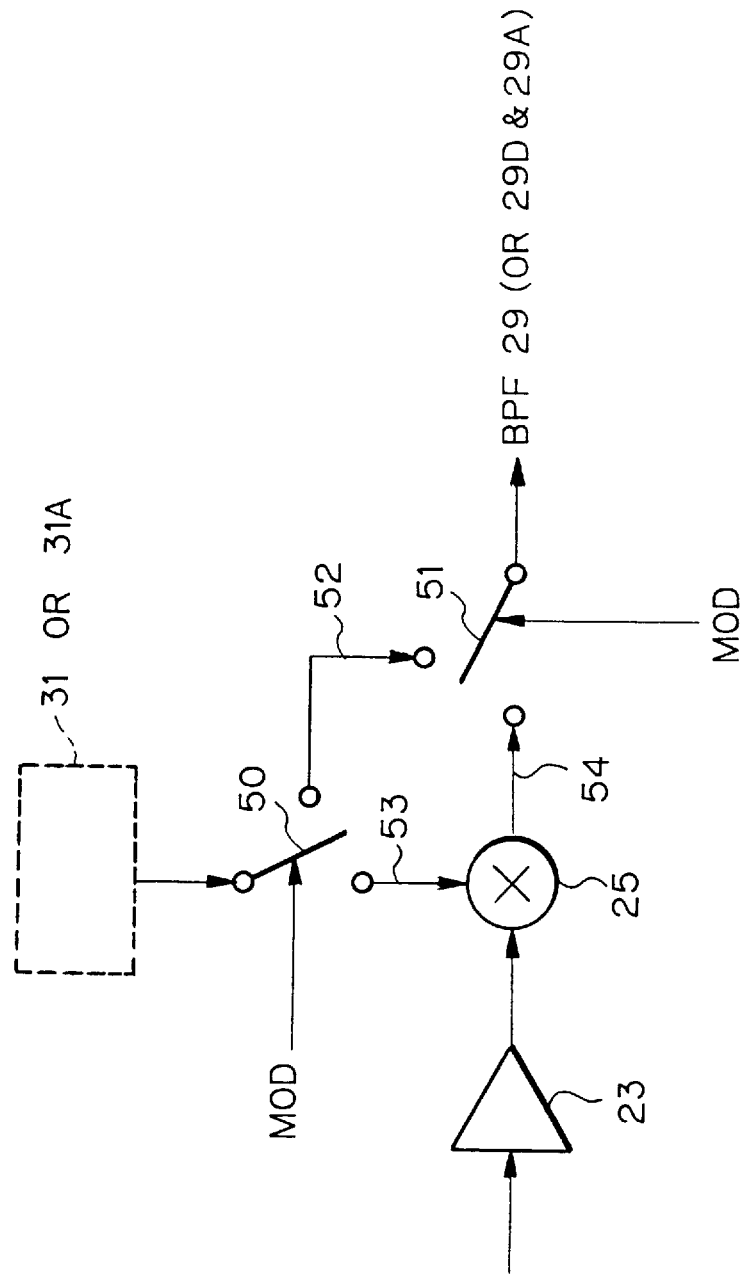

DUAL MODE TRANSMITTER

BACKGROUND OF THE INVENTION

1. Field of the Invention

The present invention relates to a dual mode transmitter capable of selectively transmitting an analog signal or a digital signal and applicable to a mobile phone or similar communication apparatus.

2. Description of the Background Art

Today, mobile phone services, both analog and digital, are available in the mobile communications field. A mobile phone adaptive to both of the two different kinds of services has been proposed in various forms, so that each user can enjoy the services with a single mobile phone. In this type of mobile phone, a single transmitter is shared by the analog and digital services.

A conventional dual mode transmitter capable of selectively transmitting an analog speech signal or a digital speech signal will be described. Assume that the transmitter uses a QPSK (Quadrature Phase Shift Keying) system and an FM (Frequency Modulation) system as a digital modulation system and an analog modulation system, respectively. A mode signal representative of a digital mode (transmission of a digital speech signal) or an analog mode (transmission of an analog speech signal) is input to the transmitter. In the digital mode as indicated by the mode signal, the transmitter generates I-phase data and Q-phase data out of the speech signal, executes orthogonal modulation with the two kinds of data, amplifies the modulated signal, and then transmits the amplified signal via an antenna. On the other hand, in the analog mode, the transmitter executes frequency modulation with the speech signal, amplifies the resulting FM signal, and then transmits the amplified signal via the antenna.

Specifically, the transmitter has a first mode switch which selects either the I-phase data or a DC voltage in accordance with the mode signal. A second mode switch selects either the Q-phase data or a DC voltage in accordance with the mode signal. An orthogonal modulator executes orthogonal modulation with the signals selected by the two mode switches. A voltage controlled oscillator (VCO) generates a first carrier signal and feeds it to the orthogonal modulator and a $\pi/2$ phase shifter. The $\pi/2$ phase shifter shifts the phase of the input first carrier signal by $\pi/2$ to thereby output a second carrier signal. The second carrier signal is also applied to the modulator. A third mode switch selects either an analog speech voltage or a DC voltage as instructed by the mode signal and delivers it to the VCO.

The first and second mode switches respectively select the I-phase data and the Q-phase data in the digital mode, and both of them select the DC voltages in the analog mode. The third mode switch selects the DC voltage in the digital mode and selects the analog speech voltage in the analog mode. As a result, the VCO outputs, in the digital mode, the first carrier signal having a constant frequency and outputs, in the analog mode, the first carrier signal whose frequency has been modulated by the analog speech voltage.

An amplifier amplifies the output of the orthogonal modulator. A band-pass filter (BPF) filters the output of the amplifier so as to limit its frequency band. A power amplifier amplifies the output of the BPF. A duplexer feeds the output of the power amplifier (signal to be transmitted) to a common antenna and feeds a signal coming in through the antenna to a receiver.

In the orthogonal modulator, a first low-pass filter (LPF) receives the output of the first mode switch. A first mixer mixes the output of the first LPF and the first carrier signal fed from the VCO. A second LPF receives the output of the second mode switch. A second mixer mixes the output of the second LPF and the second carrier signal output from the $\pi/2$ phase shifter. An adder adds the outputs of the two mixers.

In operation, in the digital mode, the first and second mode switches respectively select the I-phase data and Q-phase data in accordance with the mode signal, while the third mode switch selects the DC voltage. In this condition, the VCO plays the role of a carrier generator. The carrier signal from the VCO and the I-phase data passing through the first LPF of the orthogonal modulator are mixed by the first mixer. The resulting output of the mixer is applied to the adder. The second carrier signal from the $\pi/2$ phase shifter and the Q-phase data from the second LPF are mixed by the second mixer. The output of this mixer is also applied to the adder. In response, the adder produces the sum of the input signals as a modulated digital signal. The modulated digital signal is amplified by the amplifier, limited to a transmission frequency band by the band-pass filter (BPF), further amplified by the power amplifier, and then radiated via the duplexer and antenna.

In the analog mode, the first and second mode switches respectively select the DC voltages, as instructed by the mode signal. The third mode switch selects the analog speech voltage in accordance with the mode signal. Then, the VCO serves as an analog modulator or FM modulator and outputs an FM signal. The FM signal is simply amplified by the first mixer and then fed to the adder. Likewise, the FM signal shifted in phase by the $\pi/2$ phase shifter is simply amplified by the second mixer and then input to the adder. The sum signal from the adder is processed in the same manner as in the digital mode by the amplifier, BPF, power amplifier, and duplexer and then radiated via the antenna. It is to be noted that combining the two FM signals does not matter at all because a receiving station demodulates them by using a carrier signal synchronous to one of them.

Another conventional dual mode transmitter will be described hereinafter. The transmitter basically has a construction for transmitting the digital speech signal and additionally has the first and second switches stated above and a signal processing circuit. This transmitter, like the previous transmitter, uses the QPSK system for digital modulation and the FM system for analog modulation. However, the transmitter to be described uses a frequency modulating method different from the method of the previous transmitter. The following description will concentrate on the differences between the two transmitters.

Briefly, the transmitter receives the mode signal and executes, if the mode signal is representative of the digital mode, orthogonal modulation with I-phase data and Q-phase data derived from the speech signal. The resulting modulated signal is amplified and then transmitted via the antenna. If the mode signal is representative of the analog mode, the transmitter executes frequency modulation with the speech signal, amplifies the resulting FM signal, and then radiates it via the antenna.

Specifically, the first mode switch selects either the I-phase data or the output of the signal processing circuit in accordance with the mode signal. The second mode switch selects either the Q-phase data or the output of the signal processing circuit in accordance with the mode signal. The signal processing circuit converts the analog speech voltage to an analog speech signal.

The VCO outputs a carrier signal having a transmission frequency. Assume that the transmission frequency in the digital mode and the transmission frequency in the analog mode (center frequency of the FM signal) are identical, i.e., the carrier signal output from the VCO has the same frequency in both the digital mode and the analog mode. Circuitry including the amplifier, BPF, power amplifier, duplexer and antenna follows the orthogonal modulator.

In operation, in the digital mode, the first and second mode switches respectively select the I-phase data and Q-phase data in accordance with the mode signal. The digital speech signal is processed in the same way as in the previous conventional transmitter. In the analog mode, the first and second mode switches respectively select the output signals of the signal processing circuit. Specifically, the processing circuit transforms an input analog speech signal to I-phase data and Q-phase data and delivers them to the orthogonal modulator via the two mode switches. The transform by the processing circuit is such that the output of the adder is identical with a signal to appear when the carrier signal is subjected to frequency modulation using the analog speech signal.

As stated above, each of the conventional dual mode transmitters directly modulates an input signal to a modulated signal lying in the transmission frequency band. A dual mode transmitter using an indirect modulation system, i.e., converting an input signal to an intermediate frequency and then to a modulated signal lying in a transmission band, has not been reported in the past. This brings about the following problems.

An orthogonal modulator or similar digital modulator and electronic devices surrounding it have already been put on the market in the form of ICs (Integrated Circuits). When any one of the two conventional dual mode transmitters is implemented by such electronic devices, it sometimes fails to generate a modulated signal lying in a desired frequency band. This occurs, e.g., when a transmitter conforming to one transmission system is designed with electronic devices developed for a transmitter conforming to another transmission system. Specifically, assume that a transmitter for use in a CDMA digital mobile phone is designed with electronic devices applicable to a TDMA digital mobile phone. Because TDMA mobile phone services were introduced earlier than CDMA services, more kinds of devices are available with the former than with the latter. The devices directed toward TDMA applications have frequencies feasible for the TDMA system, but not for the CDMA system. It is, therefore, difficult to implement a transmitter based on the CDMA system and direct modulation system, by use of filters, digital modulator and other devices designed for the TDMA system.

Although there is a keen demand for a dual mode transmitter using the indirect modulation scheme, effective constructions desirable in design freedom and highly practicable are not available at the present stage of development.

SUMMARY OF THE INVENTION

It is, therefore, an object of the present invention to provide a dual mode transmitter capable of using many of existing electronic devices and enhancing the design freedom and practicability.

In accordance with the present invention, in a dual mode transmitter for modulating, in the digital mode, an input digital signal and transmitting a modulated digital signal and modulating, in the analog mode, an input analog signal and transmitting a modulated analog signal, a digital modulator modulates the input digital signal to thereby generate t h e modulated digital signal, and the outputs it. An analog modulator modulates the input analog signal to thereby generate the modulated analog signal, and then outputs it. A carrier generator generates a carrier signal for up-converting the modulated digital signal. An up-converter up-converts, in the digital mode, the modulated digital signal by using the carrier signal and receives, in the analog mode, the modulated analog signal and passes it therethrough.

BRIEF DESCRIPTION OF THE DRAWINGS

The objects and features of the present invention will become more apparent from the consideration of the following detailed description taken in conjunction with the accompanying drawings in which:

FIGS. 1A and 1B are block diagrams schematically showing a dual mode transmitter embodying the present invention;

FIG. 1 shows how FIGS. 1A and 1B are combined;

FIGS. 2A and 2B are block diagrams schematically showing a conventional dual mode transmitter;

FIG. 2 shows how FIGS. 2A and 2B are combined;

FIG. 3 is a schematic block diagram showing another conventional dual mode transmitter;

FIG. 6 is a schematic block diagram showing a modification of any one of the illustrative embodiments.

DESCRIPTION OF THE PREFERRED EMBODIMENTS

Figure 1B:
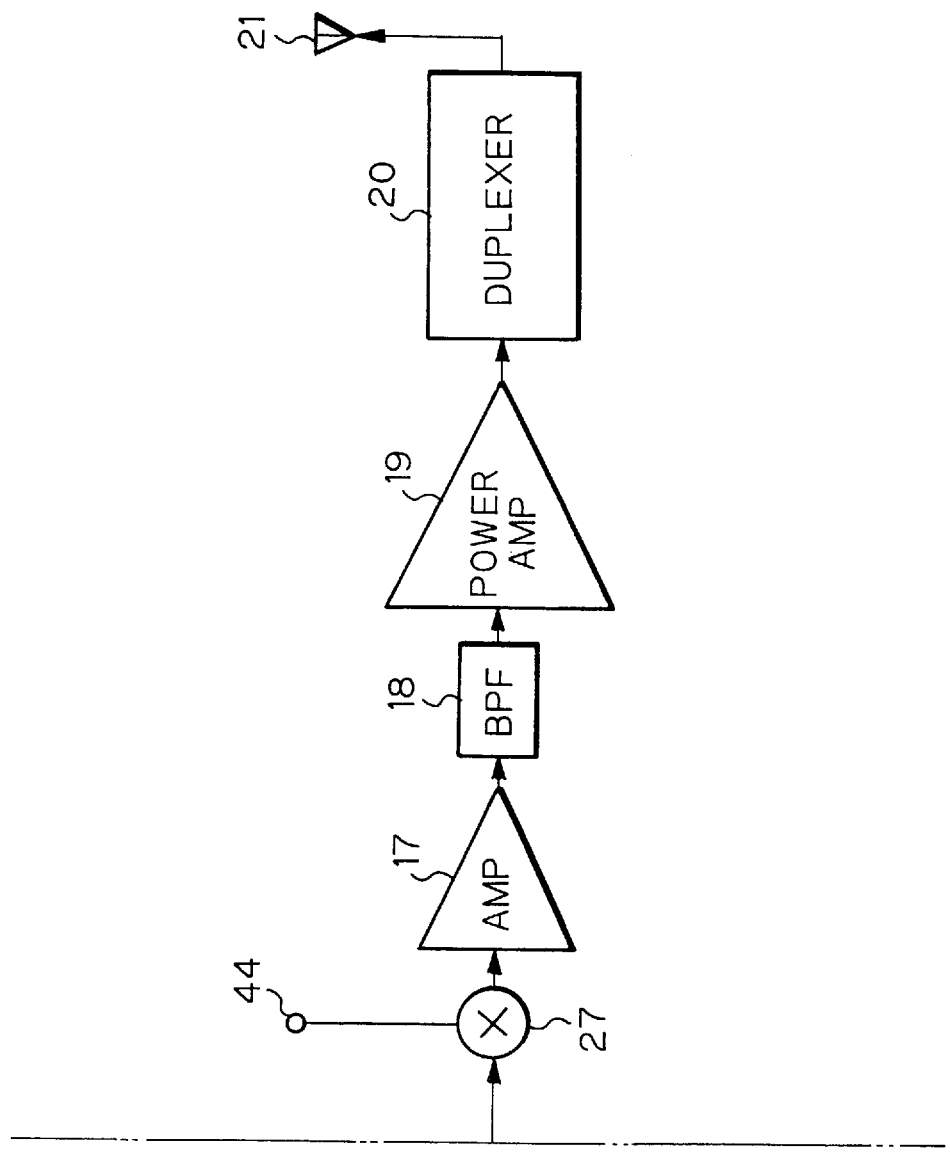

Referring to FIG. 1 the drawings, a dual mode transmitter embodying the present invention is shown. As shown, in a digital mode, a digital speech signal (I-phase data 1 and Q-phase data 11) is input to the transmitter. A digital modulating section 41 modulates the input speech signal. The modulated speech signal is up-converted and then radiated via an antenna 21 which is shared by the transmitter and a receiver, not shown. In an analog mode, an analog speech voltage 6 is input to the transmitter and modulated by an analog modulator/carrier generator 31. The speech signal 6 output from the analog modulator 31 is also radiated via the antenna 21.

Specifically, the digital modulating section 41 has a conventional construction and is made up of low-pass filters (LPFs) 4 and 14, mixers 5 and 15, a $\pi/2$ phase shifter 10, and an adder 16. The LPFs 4 and 14 respectively remove needless components from the I-phase data 1 and Q-phase data 11 input to the modulating section 41. The mixer 5 mixes the I-phase data and a carrier signal 42 also input to the modulating section 41 and having a frequency fd1. The $\pi/2$ phase shifter 10 shifts the phase of the carrier signal 42 by $\pi/2$. The mixer 15 mixes the carrier signal 42 shifted in phase by the phase shifter 10 with the Q-phase data 11. The adder 16 adds the output signals of the mixers 5 and 15 and outputs the resulting modulated digital signal. The modulating section 41 except for the $\pi/2$ phase shifter 10, i.e., an orthogonal modulator 22 is commercially available in the form of an IC.

The modulated digital signal from the adder 16 is up-coverted in two consecutive steps, as will be described later. For this reason, the frequency fd1 of the carrier signal 42 at the above digital modulation stage is set at a relatively low level.

The adder 16 is followed by an amplifier 23. The amplifier 23 is connected to a first up-converter 25 via a mode switch 33 to which the mode signal MOD is input. When the mode signal MOD is representative of the digital mode, the mode switch 33 connects the up-converter 25 to the amplifier 23. As a result, the modulated digital signal amplified by the amplifier 23 is transferred to the up-converter 25 via the switch 33. When the mode signal MOD is representative of the analog mode, the switch 33 selects a predetermined DC voltage 43 while disconnecting the up-converter 25 from the modulating section 41.

The analog modulator/carrier generator 31, connected to the up-converter 25, functions as an analog modulator in the analog mode and as a carrier generator in the digital mode. For example, the analog modulator/carrier generator 31 has a PLL (Phase Locked Loop) made up of a phase comparator (PD)31a, an LPF 31b, and a voltage controlled oscillator (VCO) 31c, and a switch 31d for selectively inputting the analog speech voltage 6 to the junction between the LPF 31b and the VCO 31c. When the mode signal MOD is representative of the digital mode, the switch 31d is opened. In this condition, the analog modulator/carrier generator 31 operates as a PLL and generates a stable carrier signal. The carrier signal from the PLL is applied to the up-converter 25. When the mode signal MOD is representative of an analog mode, the switch 31d is closed with the result that a follow-up error voltage is superposed on the input analog speech voltage 6. The resulting composite voltage is input to the VCO 31c. Consequently, the VCO 31c outputs a modulated analog signal, or FM signal, and delivers it to the up-converter 25.

The up-converter 25 may be provided with any one of conventional configurations. In the digital mode, the up-converter mixes the low-frequency modulated digital signal output from the amplifier 23 and the carrier signal output from the carrier generator 31 and having a frequency fo, thereby producing a modulated digital signal having an intermediate frequency (fd1+fo). In the analog mode, the up-converter 25 causes the modulated analog signal output from the analog modulator 31 to pass therethrough as it is. The center frequency of this modulated analog signal is equal to the intermediate frequency (fd1+fo).

Figure 4:
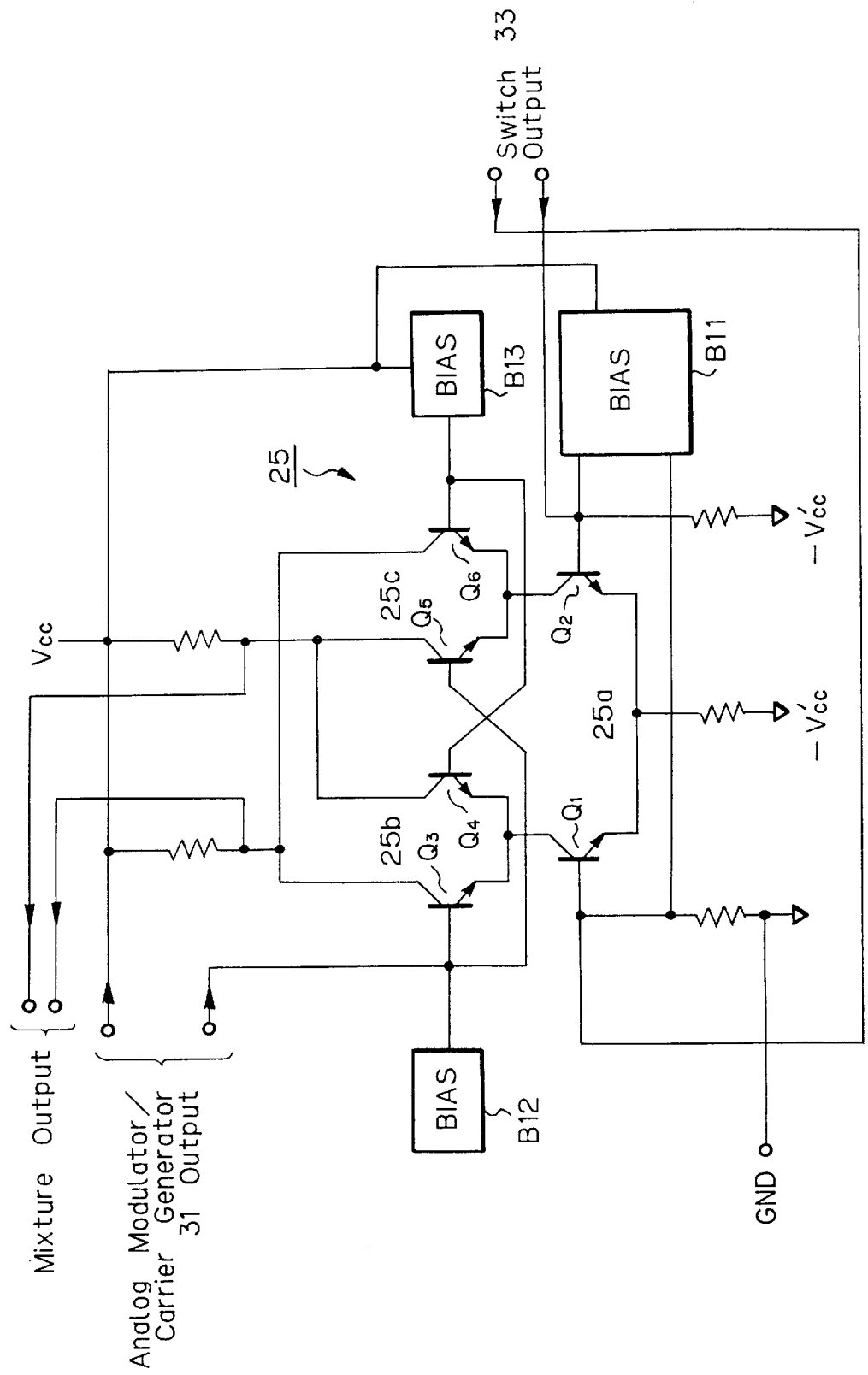
FIG. 4 is a block diagram schematically showing a specific configuration of an up-converter included in the embodiment of FIG. 1.

FIG. 4 shows a specific construction of the up-converter 25. As shown, the up-converter 25 is implemented as a double balanced differential amplifier circuit including six transistors Q1–Q6 and bias circuits B11–B13. The transistors Q1 and Q2 constitute a first differential amplification pair 25a. The signal from the switch 33, i.e., the modulated digital signal or the DC voltage is suitably biased by the bias circuit B11 and then applied to the bases of the transistors Q1 and Q2 as differential inputs (positive polarity and negative polarity). The transistor Q3 constitutes one part of a differential amplification pair 25b while the transistor Q5 constitutes one part of a differential amplification pair 25c. The signal from the analog modulator/carrier generator 31 and having one of opposite polarities, i.e., the modulated analog signal or the carrier signal is suitably biased by the bias circuit B12 and then applied to the bases of the transistors Q3 and Q5. The transistors Q4 and Q6 constitute the other parts of the differential amplification pairs 25b and 25c, respectively. The transistors Q4 and Q6 receive at their bases the signal of the other polarity output from the analog modulator/carrier generator 31 (carrier signal or modulated analog signal) and suitably biased by the bias circuit B13. As a result, a mixture of the polarities of the signals from the switch 33 and analog modulator/carrier generator 31 appears on the common collector of the transistors Q3 and Q6 and the common collector of the transistors Q4 and Q5.

In the digital mode, the mixture appearing on the above common collectors is the mixture of the modulated digital signal from the switch 33 and the carrier signal from the carrier generator 31. On the other hand, in the analog mode, the mixture is the modulated analog signal from the analog modulator 31 alone because the signal from the switch 33 is the DC voltage, i.e, the differential amplification pair 25a does not perform its function.

Referring again to FIG. 1, a band-pass filter (BPF) 29 is connected to the output of the up-converter 25 while an amplifier 26 is connected to the output of the BPF 29. The BPF 29 removes needless frequency components from the signal which is output from the up-converter 25 and has the intermediate frequency. The signal free from the needless components is amplified by the amplifier 26 and then input to a second up-converter 27. A carrier signal 44 having a transmission frequency f1 is also applied to the second up-converter 27. The up-converter 27, therefore, up-converts the modulated signal, i.e., the modulated digital or analog signal to a modulated signal having the transmission frequency f1. The up-converted signal is processed in the conventional manner. Specifically, the signal is amplified by an amplifier 17, limited to a transmission frequency band by a BPF 18, amplified by a power amplifier 19, and then radiated via a duplexer 20 and the antenna 21.

The dual mode transmitter having the above construction will be operated as follows. First, in the digital mode, the mode switch 33 selects the amplifier 23 in accordance with the mode signal MOD. At the same time, the switch 31d of the analog modulator/carrier generator 31 is opened. In this condition, the modulated digital signal from the amplifier 23 is applied to the up-converter 25. In the analog modulator/carrier generator 31, only the output voltage of the LPF 31b is input to the VCO 31c, i.e., the carrier signal is generated.

More specifically, the I-phase data 1 input to the digital modulating section 41 has its needless components removed by the LPF 4. The data I free from the needless components is mixed with the carrier signal 42 for digital modulation and having the low frequency fd1. The resulting composite signal is applied to the adder 16. Likewise, the Q-phase data 11 has its needless components removed by the LPF 14. The $\pi/2$ phase shifter 10 shifts the phase of the carrier signal 42 by $\pi/2$. The output of the LPF 14 is mixed with the output of the phase shifter 10 and then fed to the adder 16. As a result, the adder 16 outputs the modulated digital signal having a low frequency. The modulated signal is amplified by the amplifier 23 and then mixed with the carrier signal from the carrier generator 31, i.e., up-converted to the modulated digital signal having an intermediate frequency by the up-converter 25.

The modulated digital signal from the up-converter 25 is filtered by the BPF 29, amplified by the amplifier 26, and then applied to the up-converter 27. The up-converter 27 mixes the input modulated signal with the carrier signal 44 having the transmission frequency f1, thereby up-converting the modulated signal. The up-converted signal is amplified by the amplifier 17, limited to the transmission frequency band by the BPF 18, amplified by the power amplifier 19, and then radiated via the duplexer 20 and antenna 21.

In the analog mode, the mode switch 33 selects the DC voltage 43 in accordance with the mode signal MOD while the switch 31d is closed by the mode signal MOD. As a result, the digital modulating section 41 is disconnected from the up-converter 25 and successive circuitry. The analog speech voltage 6 is input to the VCO 31c of the analog modulator/carrier generator 31, so that a modulated analog signal having an intermediate frequency is produced. The modulated analog signal is fed from the analog modulator 31 to the up-converter 25. Because the modulating section 41 is isolated from the up-converter 25, the modulated analog signal from the analog modulator 31 is passed through the up-converter 25 as it is.

The modulated analog signal from the up-converter 25 is filtered by the BPF 29, amplified by the amplifier 26, and then applied to the up-converter 27 in the same manner as the modulated digital signal. The up-converter 27 mixes the input modulated signal with the carrier signal 44 having the transmission frequency f1, thereby up-converting the modulated signal. The up-converted signal is amplified by the amplifier 17, limited to the transmission frequency band by the BPF 18, amplified by the power amplifier 19, and then radiated via the duplexer 20 and antenna 21.

As stated above, the illustrative embodiment has a digital modulating section independent of common digital mode/analog mode processing circuitry, thereby constituting an indirect modulation system capable of dealing with both the digital mode and the analog mode. The embodiment is, therefore, practicable with existing electronic devices. Moreover, the design freedom is enhanced because the frequency of the output signal of the digital modulating section is not limited; adequately selecting the frequencies of the carrier signals to be applied to up-converters suffices. In addition, in the analog mode, the digital modulating section is disconnected from the common circuitry and, therefore, does not effect the modulated analog signal at all.

Hereinafter will be described two examples of a direct modulation type dual mode transmitter for comparison with the above embodiment using an indirect modulation scheme.

Figure 2B:
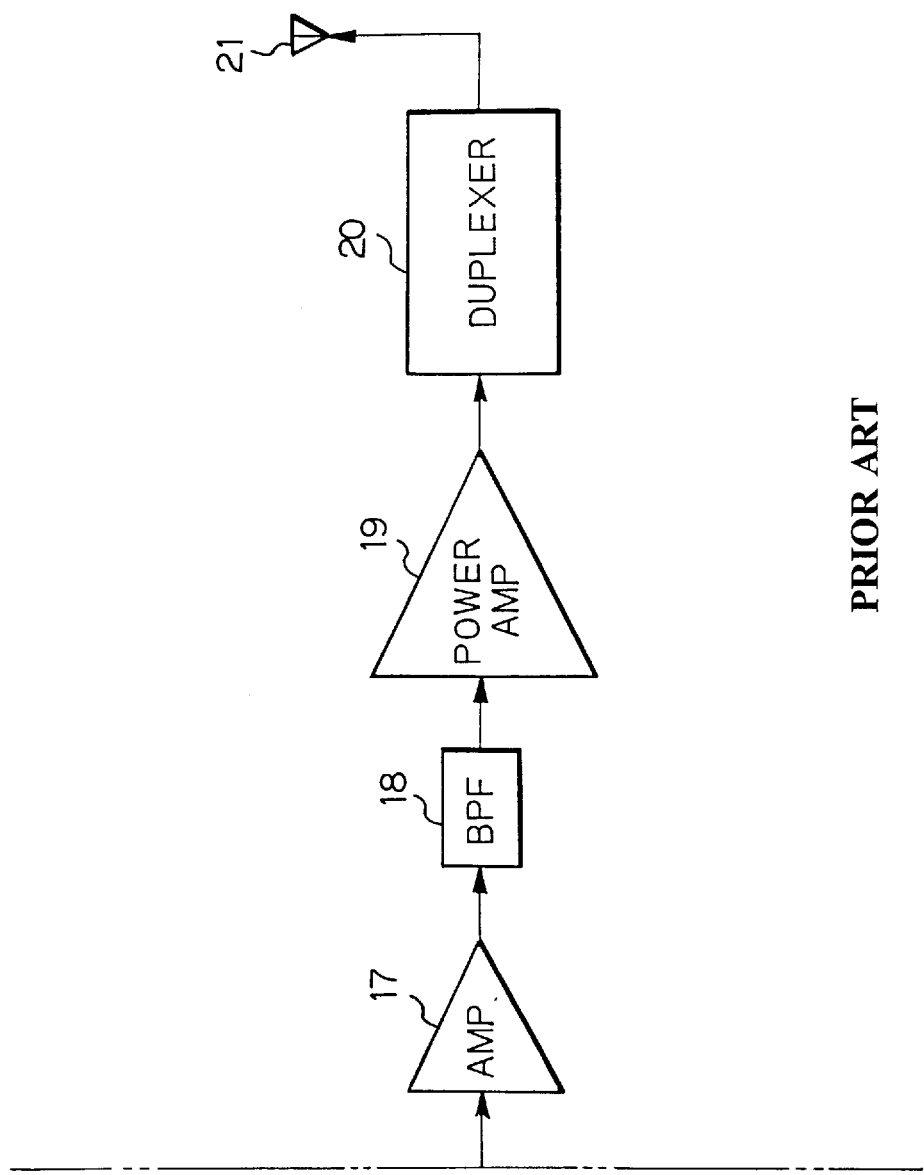

A first example of the direct modulation type transmitter is shown in FIG. 2. In FIG. 2, the same or similar constituent parts as or to the parts shown in FIG. 1 are designated by the same reference numerals. Briefly, the transmitter receives a mode signal MOD representative of the digital mode or the analog mode. When the mode signal MOD is representative of the digital mode, the transmitter executes orthogonal modulation with I-phase data and Q-phase data derived from a speech signal. The transmitter amplifies the modulated signal and then transmits it via an antenna. When the mode signal MOD is representative of the analog mode, the transmitter subjects the speech signal to frequency modulation, amplifies the resulting FM signal, and then radiates it via the antenna.

Specifically, the transmitter has a first mode switch 3 for selecting either I-phase data I or a DC voltage 2 in accordance with the mode signal MOD. A second mode switch 13 selects either Q-phase data 11 or a DC voltage 12 in accordance with the mode signal MOD. An orthogonal modulator 22 executes orthogonal modulation with the signals selected by the mode switches 3 and 13. A VCO 9 generates a first carrier signal and feeds it to the orthogonal modulator 22 and a π/2 phase shifter 10. The phase shifter 10 shifts the phase of the input first carrier signal by π/2 to thereby output a second carrier signal. The second carrier signal is also applied to the modulator 22. A third mode switch 8 selects either an analog speech voltage 6 or a DC voltage 7 as instructed by the mode signal MOD and delivers it to the VCO 9.

The mode switches 3 and 13 respectively select the I-phase data and the Q-phase data in the digital mode, and both of them select the DC voltages 2 and 12 in the analog mode. The mode switch 8 selects the DC voltage 7 in the digital mode or selects the analog speech voltage 6 in the analog mode. As a result, the VCO 9 outputs, in the digital mode, a first carrier signal having a constant frequency or outputs, in the analog mode, a first carrier signal whose frequency has been modulated by the analog speech voltage 6.

In FIG. 2, an amplifier 17 amplifies the output of the VCO 22. A BPF 18 filters the output of the amplifier 17 so as to limit its frequency band. A power amplifier 19 amplifies the output of the BPF 18. A duplexer 20 feeds the output of the power amplifier 19 (signal to be transmitted) to an antenna 21 and feeds a signal coming in through the antenna 21 to a receiver, not shown.

In the orthogonal modulator 22, an LPF 4 receives the output of the mode switch 3. A first mixer 5 mixes the output of the LPF 4 and the first carrier signal fed from the VCO 9. An LPF 14 receives the output of the mode switch 13. A second mixer 15 mixes the output of the LPF 14 and the second carrier signal output from the π/2 phase shifter 10. An adder 16 adds the outputs of the mixers 5 and 15.

The VCO 9 plays the role of a carrier generator in the digital mode and the role of a frequency modulator in the analog mode. In the analog mode, the FM signal from the VCO 9 is simply amplified by the mixer 5 while the FM signal from the π/2 phase shifter 10 is simply amplified by the mixer 15. The two amplified FM signals are added by the adder 16. It is to be noted that the addition of the above two FM signals does not matter at a receiving station at all because the receiving station uses a carrier signal synchronous to one of them for demodulation.

A reference will be made to FIG. 3 for describing a second example of the direct modulation type dual mode transmitter. The second example, like the first example, uses a QPSK for digital modulation and an FM system for analog modulation. However, the second example uses a frequency modulating method different from the method of the first example. In FIG. 3, the same or similar constituent parts as or to the parts shown in FIG. 2 are designated by the same reference numerals, and a detailed description thereof will not be made in order to avoid redundancy.

Briefly, the transmitter shown in FIG. 3 receives a mode signal MOD and executes, if it is representative of the digital mode, orthogonal modulation with I-phase data and Q-phase data derived from a speech signal. The resulting modulated signal is amplified and then transmitted via an antenna. If the mode signal MOD is representative of the analog mode, the transmitter executes frequency modulation with a speech signal, amplifies the resulting FM signal, and then radiates it via the antenna.

Specifically, the first mode switch 3 selects either the I-phase data 1 or the output of the signal processing circuit 23 in accordance with the mode signal MOD. The second mode switch 13 selects either the Q-phase data 11 or the output of the signal processing circuit 23 in accordance with the mode signal MOD. The signal processing circuit 23 converts the analog speech voltage 6 to an analog speech signal.

The VCO 9 outputs a carrier signal having a transmission frequency. In FIG. 3, assume that the transmission frequency in the digital mode and the transmission frequency in the analog mode (center frequency of the FM signal) are identical, i.e., the carrier signal output from the VCO 9 has the same frequency in both the digital mode and the analog mode.

Circuitry including the amplifier 17, BPF 18, power amplifier 19, duplexer 20 and antenna 21 follows the orthogonal modulator 22. The signal processing circuit 23 transforms an input analog speech voltage to I-phase data 1 and Q-phase data 11. The I-phase data 1 and the Q-phase data 11 are input to the orthogonal modulator 22 via the mode switches 3 and 13, respectively. The signal processing circuit 23 transforms the analog speech voltage such that the output of the adder 16 will be identical with the result of frequency modulation of the carrier signal effected by the analog speech voltage.

However, the design freedom available with the direct modulation schemes shown in FIGS. 2 and 3 is limited, compared to the indirect modulation scheme shown in FIG. 1. In addition, the direct modulation schemes cannot be implemented as easily as the indirect modulation scheme.

Figure 5:
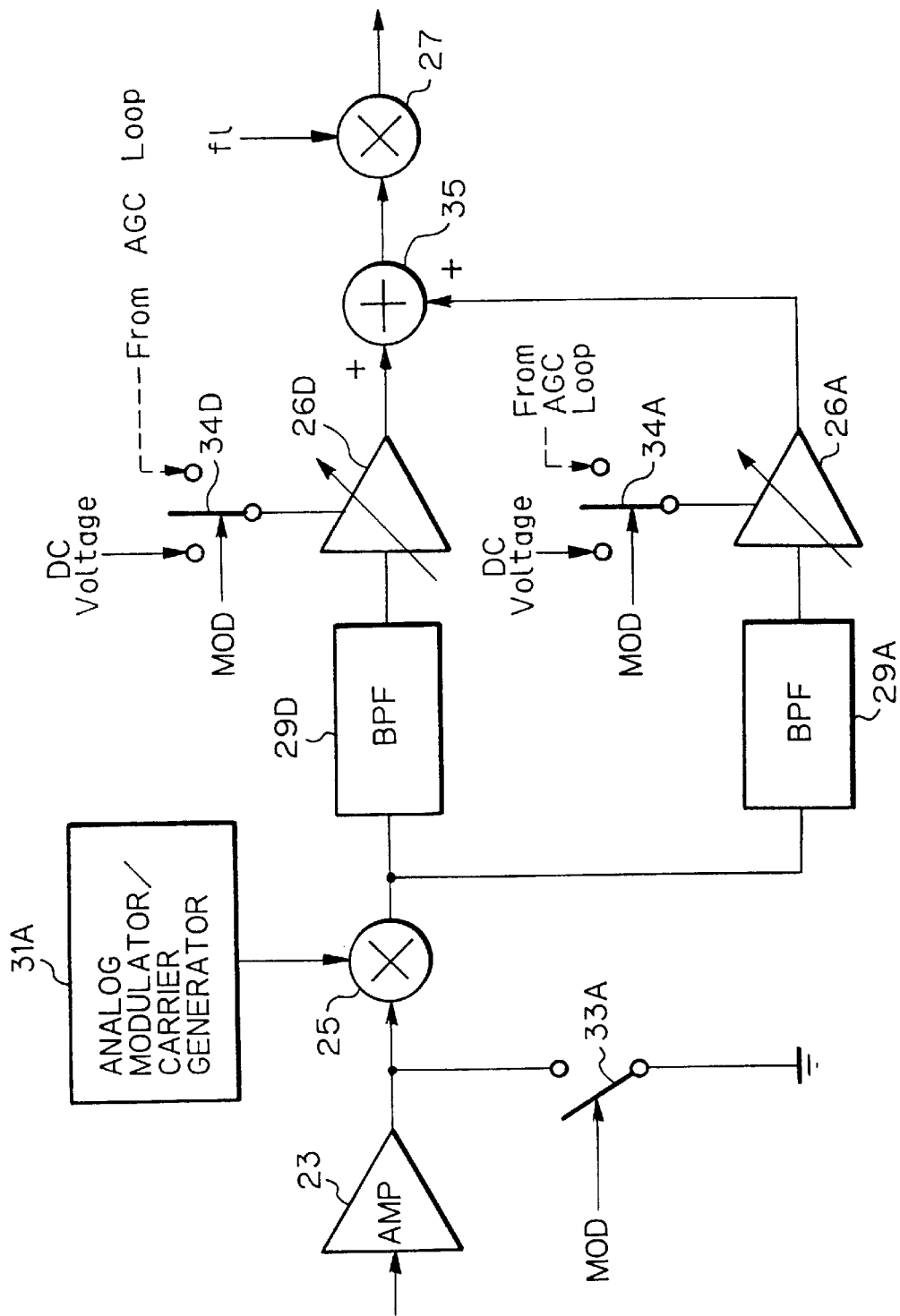
FIG. 5 is a block diagram schematically showing an alternative embodiment of the present invention.

Referring to FIG. 5, an alternative embodiment of the transmitter in accordance with the present invention will be described. In FIG. 5, the same or similar constituent parts as the parts shown in FIG. I are designated by the same reference numerals, and a detailed description thereof will not be made in order to avoid redundancy. FIG. 5 mainly shows the part of the alternative embodiment different from the previous embodiment.

In the embodiment shown in FIG. 1, the output frequencies of the analog modulator/carrier generator 31 in the digital mode and the analog mode are preselected such that the output of the up-converter 25 to appear in the digital mode and the output of the same to appear in the analog mode have the same frequency. For example, assume that in the digital mode the output of the amplifier 23 has a frequency f1 while the output of the carrier generator 31 has a frequency f2. Then, the output of the up-converter has a frequency f1+f2. In the analog mode, the output of the analog modulator 31 has a frequency f1+f2. In this manner, the output of the analog modulator/carrier generator 31 has a particular frequency in each of the digital mode and the analog mode.

By contrast, the embodiment shown in FIG. 5 has an analog modulator/carrier generator 31A which is free from the above limitation as to the frequency of its output; that is, the output frequency in the digital mode and the output frequency in the analog mode may be the same as or different from each other. For this reason, the circuitry extending from the first up-converter 25 to the second up-converter 27 is different from the circuit of the previous embodiment. In FIG. 5, a mode switch 33A corresponds to the mode switch 33 shown in FIG. 1, but the former is connected in a different way from the latter. This, however, has no relation to the above characteristic of the alternative embodiment and simply indicates that the connections of FIGS. 1 and 5 are each applicable to any of the embodiments.

The frequency of the carrier signal to be output from the analog modulator/carrier generator 31A in the digital mode is different from the center frequency of an analog modulated signal to be output from the same in the analog mode, as stated above. However, in the digital mode the up-converter 25 up-converts a modulated digital signal from the amplifier 23 by using a carrier signal, but in the analog mode it simply causes a modulated analog signal to pass therethrough, as in the previous embodiment.

The output of the up-converter 25, i.e., a digital or a modulated analog signal is routed through a BPF 29D and an amplifier 26D to an adder 35 and, at the same time, routed through a BPF 29A and an amplifier 26A to the adder 35. The BPF 29D has a pass band corresponding to the frequency band of the modulated digital signal having an intermediate frequency. Likewise, the BPF 29A has a pass band corresponding to the modulated analog signal having an intermediate frequency.

In practice, the amplifier 26, FIG. 1, for amplifying a modulated digital or a modulated analog intermediate frequency signal has an automatic gain control (AGC) function so as to maintain the transmission power constant and is implemented by a variable attenuator, although not described specifically. Likewise, the amplifiers 26D and 26A, FIG. 5, are each implemented by a variable attenuator. Mode switches 34D and 34A are respectively connected to the AGC control terminals of the amplifiers 26D and 26A. In the digital mode, the mode switch 34D selects an AGC control voltage output from an AGC loop. In the analog mode, the switch 34D selects a fixed DC voltage which maximizes the attenuation of the amplifier 26D, i.e., prevents a signal from passing through the amplifier 26D. On the other hand, the mode switch 34A selects the AGC control voltage from the AGC loop in the analog mode or selects a fixed DC voltage which maximizes the attenuation of the amplifier 26A, i.e., prevents a signal input from passing through the amplifier 26A in the digital mode.

In the above configuration, in the digital mode the adder 35 appears as if it received only a modulated digital IF signal, and in the analog mode the adder 35 appears as if it received only a modulated analog IF signal. As a result, the adder 35 delivers to the second up-converter 27 the modulated IF signal matching the operation mode.

The alternative embodiment described above achieves the same advantages as the previous embodiment. In addition, the alternative embodiment is practicable without regard to whether or not the center frequency of the modulated analog signal at the intermediate frequency stage and that of the digital modulated signal at the same stage are identical. This allows the analog modulator/carrier generator 31 and other circuit elements to be designed more freely than in the previous embodiment, thereby further enhancing the applicability of existing electronic devices.

While the embodiments shown and described are implemented as a dual mode transmitter applicable to a mobile phone, the transmitter of the present invention is similarly applicable to other various kinds of apparatuses, both wired and radio. Hence, the signal to be transmitted is not limited to a speech signal. Although the digital modulating section executes orthogonal modulation in the embodiments, use may be made of any suitable digital modulation scheme other than orthogonal modulation.

In the embodiments, the PLL of the analog modulator/carrier generator selectively serves as an analog modulator or a carrier generator, depending on the operation mode. Alternatively, the two different functions may be implemented by independent units, in which case the outputs of the individual units will be selectively input to the first up-converter 25, depending on the operation mode. Further, the second up-converter 27 may be omitted or may be followed by another up-converter, if desired.

The illustrative embodiments are each configured such that in the analog mode the output of the analog modulator/carrier generator is input to the up-converter. Alternatively, the embodiments may be modified such that in the analog mode the output of the analog modulator/carrier signal bypasses the up-converter, as will be described with reference to FIG. 6. FIG. 6 shows only the part of the modification different from the embodiments shown and described.

As shown, the modification lacks the mode switch 33 or 33A and directly feeds the output of the amplifier 23 to the up-converter 25. The analog modulator/carrier generator 31 or 31A is connected to a mode switch 50. When the mode signal MOD is representative of the digital mode, the mode switch 50 selects a signal line 53 to transfer the output of the carrier generator 31 or 31A thereto. When the mode signal MOD is representative of the analog mode, the switch 50 selects a signal line 52 and feeds the output of the analog modulator 31 thereto. A mode switch 51 selects either the signal line 52 or a signal line 54 on which the output of the up-converter 25 appears, as instructed by the mode signal MOD. Specifically, in a digital mode, the switch 51 transfers the output of the up-converter 25 to the BPF 29 or the BPFs 29D and 29A, and in the analog mode it transfers the output of the analog modulator 31 or 31A to the BPF 29 or the BPFs 29D and 29A.

The embodiments shown in FIGS. 1 and 5 are advantageous over the modification shown in FIG. 6, as follows. The modification needs two mode switches 50 and 51 while each embodiment is practicable with a single mode switch 33 or 33A. Further, assume that the analog modulator/carrier generator 31 or 31A and up-converter 25, for example, are constructed into a single semiconductor IC. Then, in the modification, the IC will additionally include the mode switch 50 connected between the analog modulator/carrier generator 31 or 31 A and the up-converter 25. By contrast, in the embodiments, the IC does not need any mode switch between the analog modulator/carrier generator 31 or 31A and the up-converter 25. Hence, the embodiments will each include a smaller number of elements than the modification when implemented as an IC.

While the embodiments and modification thereof have concentrated on an FM system, the FM system is merely a specific analog modulation system applicable to the present invention. For the digital modulation system, use may be made of, e.g., a PSK (Phase Shift Keying) modulation system, $\pi/4$ shift QPSK modulation system, or offset QPSK modulation system. Further, the mode switch 33 or 33A used to disconnect the digital modulating section may be replaced with, e.g., a variable attenuator whose attenuation increases to a noticeable degree in an analog mode operation.

In summary, it will be seen that the present invention provides a dual mode transmitter capable of using many of existing electronic devices and enhancing the design freedom and practicability. These unprecedented advantages are derived from a unique arrangement including a digital modulator for modulating an input digital signal, an analog modulator for modulating an input analog signal, a carrier generator for generating a carrier signal for up-converting the output of the digital modulator, and an up-converter for up-converting, in the digital mode, the output of the digital modulator by use of a carrier signal output from the carrier generator, and simply passing, in the analog mode, the output of the analog modulator therethrough.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A dual mode transmitter for modulating, in a digital mode, an input digital signal and transmitting a modulated digital signal and modulating, in an analog mode, an input analog signal and transmitting a modulated analog signal, the transmitter comprising:

digital modulating means for modulating the input digital signal to thereby generate the modulated digital signal, and outputting the modulated digital signal;

analog modulating means for modulating the input analog signal to thereby generate the modulated analog signal, and outputting the modulated analog signal;

carrier generating means for generating a carrier signal for up-converting the modulated digital signal;

a first up-converter for up-converting, in the digital mode, the modulated digital signal by using the carrier signal and receiving, in the analog mode, the modulated analog signal and passing the modulated analog signal therethrough;

a second up-converter following said first up-converter;

a first filter connected between said first up-converter and said second up-converter, and passing the modulated analog signal therethrough;

a second filter connected between said first up-converter and said second up-converter, and passing the modulated digital signal therethrough; and selecting means for selecting an output signal of said first filter in the analog mode and selecting an output signal of said second filter in the digital mode.

2. A transmitter in accordance with claim 1, wherein said analog modulating means and said carrier generating means comprise a single phase-locked loop which outputs the modulated analog signal in the analog mode and outputs the carrier signal in the digital mode.

3. A transmitter in accordance with claim 2, further comprising disconnecting means for disconnecting said digital modulating means from said first up-converter in the analog mode.

4. A transmitter in accordance with claim 1, further comprising disconnecting means for disconnecting said digital modulating means from said first up-converter in the analog mode.

5. A dual mode transmitter for modulating, in a digital mode, an input digital signal and transmitting a modulated digital signal and modulating, in an analog mode, an input analog signal and transmitting a modulated analog signal, the transmitter comprising:

digital modulating means for modulating the input digital signal to thereby generate the modulated digital signal, and outputting the modulated digital signal;

analog modulating means for modulating, in the analog mode, the input analog signal to thereby generate the modulated analog signal, and outputting the modulated analog signal, and for generating, in the digital mode, a carrier signal for up-converting the modulated digital signal;

an up-converter for up-converting, in the digital mode, the modulated digital signal by using the carrier signal;

a second up-converter following said up-converter;

a first filter connected between said up-converter and said second up-converter;

a second filter connected between said up-converter and said second up-converter; and selecting means for selecting an output signal of said first filter in the analog mode and selecting an output signal of said second filter in the digital mode.

6. A transmitter in accordance with claim 5, wherein in the analog mode said up-converter receives the modulated analog signal and passes the modulated analog signal therethrough.

* * * * *